(12) United States Patent
Wang et al.

(10) Patent No.: US 7,279,895 B2
(45) Date of Patent: Oct. 9, 2007

(54) FAST GENERALIZED AUTOCALIBRATING PARTIALLY PARALLEL ACQUISITION IMAGE RECONSTRUCTION ALGORITHM FOR MAGNETIC RESONANCE IMAGING

(75) Inventors: Jian Min Wang, Shenzhen (CN); Bida Zhang, Shenzhen (CN)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 11/322,884

(22) Filed: Dec. 30, 2005

(65) Prior Publication Data

US 2006/0184000 A1    Aug. 17, 2006

(30) Foreign Application Priority Data

Dec. 31, 2004    (CN)    ............... 2004 1 0082376

(51) Int. Cl.
*G01V 3/00*    (2006.01)
(52) U.S. Cl. .................................... 324/309
(58) Field of Classification Search ......... 324/300–322
See application file for complete search history.

(56) References Cited

U.S. PATENT DOCUMENTS

| | | | | |
|---|---|---|---|---|
| 6,841,998 | B1 * | 1/2005 | Griswold ................. | 324/309 |
| 7,002,344 | B2 * | 2/2006 | Griswold et al. ......... | 324/309 |
| 7,132,827 | B2 * | 11/2006 | Griswold et al. ......... | 324/309 |
| 2005/0251023 | A1 * | 11/2005 | Kannengiesser et al. ... | 600/410 |
| 2005/0264287 | A1 * | 12/2005 | Griswold et al. ......... | 324/309 |

* cited by examiner

*Primary Examiner*—Brij Shrivastav
*Assistant Examiner*—Dixomara Vargas
(74) *Attorney, Agent, or Firm*—Schiff Hardin LLP

(57) ABSTRACT

The present invention proposes a fast GeneRalized Autocalibrating Partially Parallel Acquisition (GRAPPA) image reconstruction algorithm for magnetic resonance imaging. The algorithm simplifies data fitting and channel merging in the process of reconstruction into a one-step linear calculation. Parameters needed to perform the linear calculation step can be pre-calculated and stored, thereby greatly increasing the image reconstruction speed and solving the problem of the relatively long image reconstruction time needed by prior art GRAPPA algorithms. Also, the algorithm can employ a weighting matrix to conveniently compare signal-to-noise ratio losses of images brought by different types of reconstruction methods in image domain and frequency domain.

14 Claims, 1 Drawing Sheet

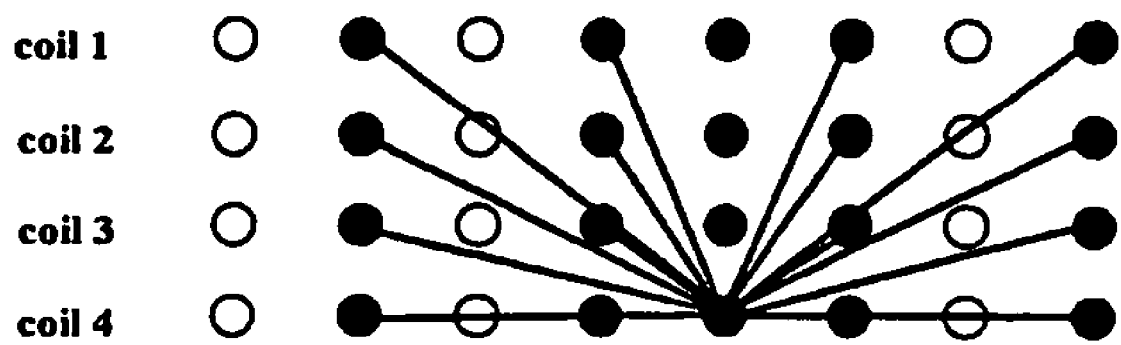

FAST GENERALIZED AUTOCALIBRATING PARTIALLY PARALLEL ACQUISITION IMAGE RECONSTRUCTION ALGORITHM FOR MAGNETIC RESONANCE IMAGING

BACKGROUND OF THE INVENTION

1. Field of the Invention

The present invention relates to a GeneRalized Autocalibrating Partially Parallel Acquisition (GRAPPA) image reconstruction algorithm, and more particularly to a fast GRAPPA image reconstruction algorithm for magnetic resonance imaging (MRI).

2. Description of the Prior Art

In MRI techniques, imaging speed is a very important parameter. Early examinations often took several hours, and later, as technologies in field intensity, gradient hardware and pulse sequence developed, a relatively large increase in the imaging speed was achieved. However, rapidly switching field gradient and high duty cycle radio frequency (RF) pulses may result in a specific absorption rate (SAR) and heat amount in organs and tissues that exceed human physiological limits. Therefore, a further increase in the imaging speed encounters a limitation.

It has been found that the imaging speed of MRI can be greatly increased with a technique that employs complicated computer image reconstruction algorithms and a coil array. Such techniques are known as parallel imaging techniques. Parallel imaging techniques include SiMultaneous Acquisition of Spatial Harmonics (SMASH), SENSitivity Encoding Parallel Acquisition Techniques (SENSE), GeneRalized Autocalibrating Partially Parallel Acquisitions (GRAPPA) etc. Parallel acquisition image reconstruction, an image reconstruction technique for fast acquisitions, utilizes differences in the spatial sensitivities of phased array coils to perform spatial encoding while using the phased array coils to perform signal acquisitions, achieving an imaging speed two to six times higher than that of conventional MRI, or even higher.

Using parallel imaging techniques imposes new requirements on MRI systems. For example, multiple receiving channels and multi-element array coils are needed, coil sensitivity should be calibrated, and special data processing and image reconstruction methods must be adopted.

SMASH is a parallel acquisition reconstruction method that employs coil sensitivity to fit a spatial harmonic function and fills under-sampled data. The algorithm thereof is characterized by data of all channels being added directly to serve as a basis and subject for multi-channel fitting. There is a relatively large error present in the fitting operation of said algorithm, causing severe artifacts in SMASH images as well as low signal-to-noise ratios (SNRs).

GRAPPA is an enhanced SMASH sequence, the GRAPPA algorithm utilizes sampled data of all channels to fit and fill under-sampled data of each of the channels, and performs channel combination operation on fitted full-sampled image of each of the channels, i.e., calculating the sum of squares for each image, adding the sum, and obtaining the extraction of square root of the addition to obtain a resulting image. The GRAPPA algorithm reduces the fitting error and improves the image quality. GRAPPA, however, has a relatively long image reconstruction time since the time needed to fit full channel data is proportional to the number of channels. As the number of channels for parallel acquisitions in MRI devices is increased gradually, this disadvantage of GRAPPA in terms of the image reconstruction speed will become more and more apparent.

Therefore, an urgent problem in the field of MRI is how to provide a fast GRAPPA image reconstruction algorithm that will greatly increase the calculation speed of the GRAPPA image reconstruction and calculate SNR losses of images obtained by parallel acquisition image reconstruction algorithms in the image domain and the frequency domain.

SUMMARY OF THE INVENTION

An main object of the present invention is to provide a method for MRI that greatly increases the calculation speed of GRAPPA image reconstruction.

Another object of the present invention is to provide a fast GRAPPA image reconstruction algorithm for MRI that calculates SNR losses of images obtained by parallel acquisition image reconstruction algorithms in the image domain and the frequency domain.

These objects are achieved in accordance with the present invention by a fast GRAPPA image reconstruction algorithm for MRI, including the following steps:

(i) expressing the fitting calculation of a channel in the frequency domain as convolutions of channels, which are transformed into the image domain;

(ii) converting the channel combination calculation in the image domain into a linear calculation of images of individual channels and the sensitivities of the coils; and (iii) merging the linear calculations in steps (i) and (ii) as a weighting matrix.

In step (i), the formula for expressing fitting calculation of a channel as convolution calculations of channels is $$rawdata_{kCh}^{full} = \sum_{iCh=1...nCh} rawdata_{iCh}^{ppa} \otimes F_{iCh,kCh},$$

where $rawdata_{kCh}^{full}$ represents the fully-sampled k-space data of the kChth $kCh^{th}$ channel fitted after the convolution, $rawdata_{iCh}^{ppa}$ represents the under-sampled k-space data of the $iCh^{th}$ channel used to fit, and $F_{iCh,kCh}$ are the convolution kernels derived based on the fitting parameter.

By performing a Fourier transform on $F_{iCh,kCh}$, the convolution is transformed into a point multiplication calculation in image domain as follows:

$$image_{kCh}^{full} = \sum_{iCh=1...nCh} image_{iCh}^{ppa} \cdot f_{iCh,kCh},$$

where $image_{kCh}^{full}$ is the fully-sampled image of the kChth channel, $image_{iCh}^{ppa}$ is the under-sampled image of the $iCh^{th}$ channel, and $f_{iCh,kCh}$ is the Fourier transform of $F_{iCh,kCh}$.

In step (ii), the formula for the merging calculation by a sum of squares is $$image^{SOS} = \sqrt{\sum_{iCh=1...nCh} image_{iCh} \cdot image_{iCh}^*};$$

and when the sensitivity profile of the $iCh^{th}$ channel is $S_{iCh}$, the combination calculation by a sum of squares (SOS) can also be expressed as $$image^{SOS} = |image| \sqrt{\sum_{iCh=1...nCh} s_{iCh} \cdot s_{iCh}^*} = |image| \cdot I^{SOS},$$

where $I^{SOS}$ is the SOS profile obtained after performing the combination calculation by a sum of squares on the sensitivities of the coils and the $image^{sos}$ is achieved by multiplying the original image by $I^{SOS}$ of the coils.

In step (ii), the merging calculation by a sum of squares can also employ a combination method based on multiplication by the sum of complex conjugate (SCS) sensitivity weighted coil image, and the formula thereof is $$image^{SOS} = \sum_{iCh=1...nCh} image_{iCh} \cdot s_{iCH}^{SOS} = |image| \cdot I^{SOS}, \text{ where } image^{SCS}$$

where $image^{SCS}$ is the image obtained by the combination method employing SCS, $s_{iCh}^{SOS}$ is the sensitivities of the coils educed based on $I^{SOS}$, and $I^{SOS}$ is as described above, and the formula for calculating $$s_{iCh}^{SOS} = image_{iCh} \Big/ \sqrt{\sum_{iCh} image_{iCh} \cdot image_{iCh}^*}.$$

The calculations in steps (i) and (ii), for being linear, can be expressed as a consecutive operation of two sparse matrixes. Therefore, the combination calculation of the two steps in step (iii) is equivalent to multiplying the two sparse matrixes, and thus middle steps thereof are omitted, achieving the effect of accelerating the calculation. The weighting matrix by multiplying the two sparse matrixes is $$w_{kCh} = \sum_{iCh=1...nCh} f_{iCh,kCh} \cdot s_{iCh}^{SOS^*}.$$

In the fast GRAPPA image reconstruction algorithm for MRI according to the present invention, the accelerated calculation can be performed in the frequency domain, for performing the accelerated calculation in the frequency domain, after the calculation in step (i), a convolution of data of individual channels is performed and the Fourier transformation of the sensitivities of the coils is done once again, and a further Fourier transformation is performed to obtain the combined image. The formula for performing the accelerated calculation in the frequency domain is $$rawdata^{SCSfull} = \sum_{iCh=1...nCh} rawdata_{iCh}^{full} \otimes S_{iCh}^{SOS^*},$$

where $s_{iCh}^{SOS}$ and $s_{iCh}^{SOS}$ are a Fourier transform pair.

The fast GRAPPA image reconstruction algorithm for MRI according to the present invention can also use the weighting matrix to conveniently compare SNR losses of images brought by different types of reconstruction methods in image domain and frequency domain based on the formula as follows:

$$SNR^{rel} = \frac{\sum_{k=1...m=nCh} w_{kCh} \cdot s_{kCh}^{SOS}}{\sqrt{\sum_{k=1...nCh} |s_{kCh}^{SOS}|^2} \cdot \sqrt{\sum_{k=1...nCh} |w_{kCh}|^2}}.$$

In summary, the fast GRAPPA image reconstruction algorithm for MRI according to the present invention can simplify data fitting and channel merging in the process of reconstruction into one-step linear calculation, and parameters needed to perform the linear calculation step can be pre-calculated and stored, thereby greatly increasing the image reconstruction speed. Also, the inventive method can use the weighting matrix to conveniently compare SNR losses of images brought by different types of reconstruction methods in the image domain and the frequency domain, thereby solving the problem of the relatively long image reconstruction time needed by conventional GRAPPA algorithms

DESCRIPTION OF THE DRAWING

The single FIGURE is a schematic diagram for fitting fully-sampled data with under-sampled data by the fast GRAPPA image reconstruction algorithm for MRI according to the present invention.

DESCRIPTION OF THE PREFERRED EMBODIMENTS

In functional imaging applications, there is a need for collecting multiple images of the same tissue in the same position at different points in time for several repetitions under the same imaging parameters. Under such conditions, the sensitivity of the coils is constant. Therefore, the fast GRAPPA image reconstruction algorithm for MRI according to the present invention simplifies data fitting and channel combination in the process of reconstruction into a one-step linear calculation. Parameters needed to perform the linear calculation step can be pre-calculated and stored, thereby greatly increasing the image reconstruction speed.

The fast GRAPPA image reconstruction algorithm for MRI according to the present invention includes the initial step of expressing the fitting calculation of a channel in the frequency domain as convolutions of channels and then transforming them into the image domain.

Referring to the FIGURE, the principle of expressing the fitting calculation of GRAPPA in the frequency domain as a convolution and transforming the convolution into the image domain is illustrated by an example, in which under-sampled data of four channels for four coils are used to fit fully-sampled data of the fourth channel, but the present invention is not limited to this example. In the FIGURE, white points represent under-sampled data that have not been filled, points with lines leading thereto represent data that are being filled by the fitting method, and black points represent actually sampled data. Since the data fitting is a linear calculation, the fitting calculation of the fourth channel can be converted into convolutions of the four channels:

$$rawdata_{kCh}^{full} = \sum_{iCh=1...nCh} rawdata_{iCh}^{ppa} \otimes F_{iCh,kCh} \quad (1)$$

where $rawdata_{kCh}^{full}$ represents the fully-sampled k-space data of the kChth channel fitted by the convolution. In the FIGURE kCh is 4. rawdata$_{iCh}^{ppa}$ represents the under-sampled k-space data of the ichth channel used to fit. $F_{iCh,kCh}$ is the convolution kernel educed based on the fitting parameter. By performing Fourier transform on $F_{iCh,kCh}$, the convolution calculation can also be transformed into point multiplication calculation in image domain as follows:

$$\text{image}_{kCh}^{full} = \sum_{iCh=1...nCh} \text{image}_{iCh}^{ppa} \cdot f_{iCh,kCh} \quad (2)$$

where image$_{iCh}^{full}$ is the fully-sampled image of the kCh$^{th}$ channel, image$_{iCh}^{ppa}$ is the under-sampled image of the iCh$^{th}$ channel, and $f_{iCh,kCh}$ is the Fourier transform of $F_{iCh,kCh}$.

The second step of the method is converting the SOS channel combination calculation in the image domain into a linear calculation of images of individual channels and sensitivities of the coils.

The formula for the combination calculation by a sum of squares is:

$$\text{image}^{SOS} = |\text{image}| \sqrt{\sum_{iCh=1...nCh} \text{image}_{iCh} \cdot \text{image}_{iCh}^*} \quad (3)$$

If the sensitivity of the iCh$^{th}$ channel is $s_{iCh}$, the combination calculation via sum of squares can also be expressed as:

$$\text{image}^{SOS} = |\text{image}| \sqrt{\sum_{iCh=1...nCh} S_{iCh} \cdot S_{iCh}^*} = |\text{image}| \cdot I^{SOS} \quad (4)$$

where $I^{SOS}$ is the image obtained after performing the merging calculation by a sum of squares on the sensitivities of the coils. It is not difficult to prove that the image obtained by the combination calculation by a sum of squares is achieved by multiplying the original image by $I^{SOS}$ of coils.

The formula of a combination method based on the sum of complex conjugate sensitivity (SCS) weighted coil image is.

$$\text{image}^{SCS} = \sum_{iCh=1...nCh} \text{image}_{iCh} \cdot S_{iCh}^{SOS*} = |\text{image}| \cdot I^{SOS} \quad (5)$$

where image$^{SCS}$ is the image obtained by the combination method employing SCS, and $S_{iCh}^{SOS}$ is the sensitivity of the coils educed based on $I^{SOS}$. The formula is as follows:

$$S_{iCh}^{SOS} = \frac{\text{image}_{iCh}}{\sqrt{\sum_{iCh} \text{image}_{iCh} \cdot \text{image}_{iCh}^*}} \quad (6)$$

The equivalence of the two combination methods is easy to prove.

The third step in the inventive method is to merge the linear calculations in steps (i) and (ii) as a weighting matrix.

The calculations in steps (i) and (ii), being linear, can be expressed as a consecutive operation of two sparse matrixes. Merging of the two steps is equivalent to multiplying the two sparse matrixes, and thus middle steps thereof are omitted, thereby accelerating the calculation.

The weighting matrix is expressed as follows:

$$w_{kCh} = \sum_{iCh=1...nCh} f_{iCh,kCh} \cdot S_{iCh}^{SOS*} \quad (7)$$

The accelerated calculation can be performed in the frequency domain.

The three calculation steps described above can be performed completely in the frequency domain. For this purpose, after the calculation of formula (1), the convolution is performed on data of individual channels with the Fourier transform of the sensitivities of the coils being done once again, and further performing a Fourier transformation to obtain the merged image:

$$\text{rawdata}^{SCSfull} = \sum_{iCh=1...nCh} \text{rawdata}_{iCh}^{full} \otimes S_{iCh}^{SOS*} \quad (8)$$

where $S_{iCh}^{SOS}$ and $S_{iCh}^{SOS}$ are a Fourier transform pair. Performing the accelerated calculation in the image domain or doing so in the frequency domain are substantially equivalent and the main difference therebetween lies in the truncation error present when using the convolution $S_{iCh}^{SOS}$ in the frequency domain.

The weighting matrix can be used to calculate SNR losses of images.

Using the weighting matrix conveniently allows a comparison SNR losses of images obtained by different types of reconstruction methods in the image domain and the frequency domain. Before the inventive method, the problem of SNR loss has not been addressed in parallel reconstruction methods in image domain. The formula is as follows:

$$SNR^{rel} = \frac{\sum_{k=1...nCh} w_{kCh} \cdot S_{kCh}^{SOS}}{\sqrt{\sum_{k=1...nCh} |S_{kCh}^{SOS}|^2} \cdot \sqrt{\sum_{k=1...nCh} |w_{kCh}|^2}} \quad (9)$$

In summary, in an embodiment of the fast GRAPPA image reconstruction algorithm for MRI according to the present invention, assuming the number of channels is eight and the image resolution for full sampling is 256×256, the amount of calculation needed to reconstruct an image using the fast GRAPPA image reconstruction algorithm according to the present invention, by performing said steps (i) to (v), is only that for eight times of two-dimensional Fourier transform, 256×256×8 times of multiplication of complex numbers and 256×256×7 times of addition of complex numbers. In addition, compared to conventional GRAPPA, the fast GRAPPA image reconstruction algorithm according to the present invention can shorten the reconstruction time by more than an order of magnitude since inverse calculation is not needed.

Although modifications and changes may be suggested by those skilled in the art, it is the intention of the inventors to embody within the patent warranted hereon all changes and modifications as reasonably and properly come within the scope of their contribution to the art.

We claim:

1. A fast GeneRalized Autocalibrating Partially Parallel Acquisition (GRAPPA) image reconstruction method for magnetic resonance imaging, comprising the steps of:
   (i) expressing s fitting calculation of a channel in the frequency domain as convolutions of channels and transforming the convolution into the image domain;
   (ii) converting a SOS channel combination calculation in the image domain into a linear calculation of images of individual channels and sensitivities of the coils; and
   (iii) merging the linear calculations in steps (i) and (ii) as a weighting matrix.

2. A method as claimed in claim 1, comprising in step (i), expressing the fitting calculation of a channel as convolutions of channels $$rawdata_{kCh}^{full} = \sum_{iCh=1...nCh} rawdata_{iCh}^{ppa} \otimes F_{iCh,kCh},$$

where $rawdata_{kCh}^{full}$ is the fully-sampled k-space data of the $kCh^{th}$ channel fitted after the convolution calculation, $rawdata^{iChppa}$ is the under-sampled k-space data of the $iCh^{th}$ channel used to fit, and $F_{iCh,kCh}$ is the convolution kernel derived based on fitting parameters.

3. A method as claimed in claim 2 comprising performing a Fourier transform on $F_{iCh,kCh}$, to transform the convolution into a point multiplication calculation in the image domain as $$image_{kCh}^{image} = \sum_{iCh=1...nCh} image_{iCh}^{ppa} \cdot f_{iCh,kCh},$$

where $image_{kCh}^{full}$ is the fully-sampled image of the $kCh^{th}$ channel, $image_{iCh}^{ppa}$ is the under-sampled image of the $iCh^{th}$ channel, and $f_{iCh,kCh}$ is the Fourier transform of $F_{iCh,kCh}$.

4. A method as claimed in claim 1, comprising in step (ii), performing the combination calculation as a sum of squares as $$image^{SOS} = \sqrt{\sum_{iCh=1...nCh} image_{iCh} \cdot image_{iCh}^*}.$$

5. A method as claimed in claim 4 comprising performing steps (i) and (ii) linearly as a consecutive action of two sparse matrices and, in step (iii), merging the linear calculations in steps (i) and (ii) by multiplying said two sparse matrices, as an accelerated calculation.

6. A method as claimed in claim 4, comprising multiplying the two sparse matrixes to obtain the weighting matrix as $$w_{kCh} = \sum_{iCh=1...nCh} f_{iCh,kCh} \cdot s_{iCh}^{SOS^*}.$$

7. A method as claimed in claim 4, wherein sensitivity of the $iCh^{th}$ channel is $s_{iCh}$, and performing the combination calculation as a sum of squares as $$image^{SOS} = |image| \sqrt{\sum_{iCh=1...nCh} s_{iCh} \cdot s_{iCh}^*} = |image| \cdot I^{SOS},$$

where $I^{SOS}$ is the SOS profile obtained after performing the combination calculation via sum of squares on the sensitivities of the coils, and $image^{SOS}$ is achieved by multiplying the original image by $I^{SOS}$ of coils.

8. A method as claimed in claim 1 comprising, in step (ii), performing the merging calculation as a sum of squares as a combination method based on the sum of complex conjugate sensitivity (SCS) weighted coil images, as $$image^{SCS} = \sum_{iCh=1...nCh} image_{iCh} \cdot s_{iCh}^{SOS^*} = |image| \cdot I^{SOS},$$

where $image^{SCS}$ is the SOS profile.

9. A method as claimed in claim 8, comprising calculating $s_{iCh}^{SOS}$ as $$s_{iCh}^{SOS} = image_{iCh} \Big/ \sqrt{\sum_{iCh} image_{iCh} \cdot image_{iCh}^*}.$$

10. A method as claimed in claim 8 comprising performing steps (i) and (ii) linearly as a consecutive action of two sparse matrices and, in step (iii), merging the linear calculations in steps (i) and (ii) by multiplying said two sparse matrices, as an accelerated calculation.

11. A method as claimed in claim 10, comprising performing the accelerated calculation in the frequency domain.

12. A method as claimed in claim 11, comprising performing the accelerated calculation in the frequency domain by after step (i), performing a convolution of data of individual channels and the Fourier transform of the sensitivity functions of coils again, and further performing a Fourier transform to obtain the merged image.

13. A method as claimed in claim 12, comprising performing the accelerated calculation in the frequency domain as $$rawdata^{SCSfull} = \sum_{iCh=1...nCh} rawdata_{iCh}^{full} \otimes S_{iCh}^{SOS},$$

where $S_{iCh}^{SOS}$ and $S_{iCh}^{soso}$ are a Fourier transform pair.

14. A method as claimed in claim 11, comprising using the weighting matrix to compare respective signal-to-noise ratio losses of images obtained by different types of reconstruction methods in the image domain and the frequency domain to obtain a relative signal-to-noise ratio:

$$SNR^{rel} = \frac{\sum_{k=1...nCh} w_{kCh} \cdot s_{kCh}^{SOS}}{\sqrt{\sum_{k=1...nCh} |s_{kCh}^{SOS}|^2} \cdot \sqrt{\sum_{k=1...nCh} |w_{kCh}|^2}}.$$

* * * * *